(12) United States Patent
Lin et al.

(10) Patent No.: US 11,843,360 B2
(45) Date of Patent: *Dec. 12, 2023

(54) POWER COMBINER/DIVIDER

(71) Applicant: Analog Devices International Unlimited Company, Limerick (IE)

(72) Inventors: Song Lin, Burlington, MA (US); Xudong Wang, Colorado Springs, CO (US); Kefei Wu, Beaverton, OR (US); Christopher Eugene Hay, Colorado Springs, CO (US)

(73) Assignee: Analog Devices International Unlimited Company, Limerick (IE)

( * ) Notice: Subject to any disclaimer, the term of this patent is extended or adjusted under 35 U.S.C. 154(b) by 57 days.

This patent is subject to a terminal disclaimer.

(21) Appl. No.: 17/324,926

(22) Filed: May 19, 2021

(65) Prior Publication Data

US 2021/0297051 A1 Sep. 23, 2021

Related U.S. Application Data

(63) Continuation of application No. 16/672,929, filed on Nov. 4, 2019, now Pat. No. 11,043,931.

(51) Int. Cl.
*H03H 7/18* (2006.01)
(52) U.S. Cl.
CPC .................................. *H03H 7/185* (2013.01)
(58) Field of Classification Search
CPC .... H03H 7/185; H03H 7/0115; H03H 7/0123; H03H 7/09; H03H 2001/0078; H03H 7/48; H03H 7/16

See application file for complete search history.

(56) References Cited

U.S. PATENT DOCUMENTS 5,430,418 A 7/1995 Blodgett
5,469,129 A 11/1995 Dydyk
(Continued)

FOREIGN PATENT DOCUMENTS

CN 100401579 C 7/2008
CN 201557083 U 8/2010
(Continued)

OTHER PUBLICATIONS

"U.S. Appl. No. 16/672,929, Notice of Allowance dated Feb. 17, 2021", 8 pgs.
(Continued)

*Primary Examiner* — Andrea Lindgren Baltzell
*Assistant Examiner* — Kimberly E Glenn
(74) *Attorney, Agent, or Firm* — Schwegman Lundberg & Woessner, P.A.

(57) ABSTRACT

A power combiner/divider circuit can be structured having a base structure with the addition of an odd-mode capacitor and a low pass network at an end of the base structure or structured having a base structure with the addition of an inductor and a high pass network at an end of the base structure. The power combiner/divider circuit can be implemented as a port coupled to multiple ports with low pass networks or high pass networks arranged at the ends of paths to the multiple ports. In embodiments using low pass base structures or low pass networks coupled to the base structures, inductors in such low pass sections can be positively coupled on a pair-wise basis.

17 Claims, 9 Drawing Sheets

(56) References Cited

U.S. PATENT DOCUMENTS

| | | |
|---|---|---|
| 5,650,756 A | 7/1997 | Hayashi |
| 6,037,845 A | 3/2000 | Parker |
| 6,054,906 A | 4/2000 | Kim |
| 7,482,893 B2 | 1/2009 | Itoh et al. |
| 7,492,239 B1 | 2/2009 | Sarkees |
| 8,180,303 B2 | 5/2012 | Dupuy et al. |
| 8,508,296 B1 | 8/2013 | Mustafa et al. |
| 9,203,473 B1 | 12/2015 | Jimenez De Parga Bernal et al. |
| 9,246,444 B2 | 1/2016 | Hase et al. |
| 9,667,216 B2 | 5/2017 | Szopko |
| 9,680,196 B2 | 6/2017 | Yoon |
| 10,116,281 B2 | 10/2018 | Lee et al. |
| 10,177,722 B2 | 1/2019 | Wang et al. |
| 10,263,314 B2 | 4/2019 | Grede et al. |
| 10,608,313 B2 | 3/2020 | Wang et al. |
| 11,043,931 B2 * | 6/2021 | Lin ............... H03H 7/46 |
| 2010/0244981 A1 * | 9/2010 | Gorbachov ....... H03H 7/48 |
| | | 333/124 |
| 2017/0047904 A1 | 2/2017 | Szopko |
| 2019/0214700 A1 | 7/2019 | Wang et al. |
| 2020/0228070 A1 * | 7/2020 | Wang ............. H03F 1/565 |
| 2021/0135646 A1 | 5/2021 | Lin et al. |

FOREIGN PATENT DOCUMENTS

| | | |
|---|---|---|
| CN | 104332687 A | 2/2015 |
| CN | 206293591 U | 6/2017 |
| CN | 206894596 U | 1/2018 |
| CN | 108832247 A | 11/2018 |
| EP | 0063414 A2 | 10/1982 |
| JP | 2002280864 A | 9/2002 |
| JP | 2005101946 A | 4/2005 |
| KR | 20100004440 A | 1/2010 |
| KR | 101351693 B1 | 1/2014 |

OTHER PUBLICATIONS

"European Application Serial No. 20201652.3, Extended European Search Report dated Mar. 17, 2021", 10 pgs.

Ju, Inchan, et al., "A Compact, Wideband Lumped-Element Wilkinson Power Divider/Combiner Using Symmetric Inductors with Embedded Capacitors", IEEE Microwave and Wireless Components Letters, 26(8), (Aug. 2016), 595-597.

Kawai, Tadashi, et al., "Design Method of Lumped-Element Dualband Wilkinson Power Dividers Based on Frequency Transformation", Microwave Conference Proceedings (APMC), 2010 Asia-Pacific, IEEE, (Dec. 7, 2010), 710-713.

Love, Matthew, et al., "Lumped-Element Wilkinson Power Combiners Using Reactively Compensated Star/Delta Coupled Coils in 28-nm Bulk CMOS", IEEE Transactions on Microwave Theory and Techniques, 67(5), (May 2019), 1798-1811.

Peng, Na, et al., "Ku-band compact Wilkinson power divider based on multi-tap inductor technique in 65-nm CMOS", Electronics Express, 15(23), (2018), 8 pgs.

Yu, Tiku, "Design of Length-Saving Multiway Wilkinson Power Dividers", IEEE Access 6, (2018), 14093-14105.

U.S. Appl. No. 16/672,929, filed Nov. 4, 2019, Power Combiner/Divider.

"European Application Serial No. 20201652.3, Communication Pursuant to Article 94(3) EPC dated Jun. 1, 2023", 5 pgs.

* cited by examiner

POWER COMBINER/DIVIDER

CLAIM OF PRIORITY

This is a continuation of U.S. patent application Ser. No. 16/672,929, filed Nov. 4, 2019, which is hereby incorporated by reference herein in its entirety.

FIELD OF THE DISCLOSURE

This document relates to electrical circuits and in particular to power combiner/divider circuits.

BACKGROUND

A power combiner is widely used in microwave systems, millimeter wave systems, and communication systems. A power combiner can be used in a phased array application, where a phased array has many different elements, each of which receives a fraction of a signal that can have different phases. The received signals can be combined together to provide a combined signal to obtain more information. In a reverse application, a power divider can receive a signal and provide a number of paths for transmission of the signal.

An example of a power divider/combiner topology is a Wilkinson power divider/combiner. The Wilkinson power divider/combiner is a straight forward design to construct and has some extremely useful properties. In this design, all the ports can be matched and there is relatively high isolation between output ports. This design is reciprocal and ideally lossless when output ports are matched, where implemented designs will have some loss. The design for a basic Wilkinson topology can include a port (port 1) coupled to two ports (port 2 and port 3), where the two ports are coupled by a resistor that isolates the two ports from each other. In a basic power divider application, port 1 is the port from which its power is to be divided with ports 2 and 3, at the end of two paths from port 1, that receive the divided power. In a basic power combiner application, port 2 and port 3 are ports with their power to be combined and port 1 is the port with the combined power.

There are a number of different types of Wilkinson power combiner/dividers. Wilkinson power combiner/dividers can be constructed in a transmission line format, a microstrip line format, a stripline format, a coplanar waveguide (CPW) format, or other similar transmission formats. Wilkinson power combiner/dividers can be constructed in a lumped element. Wilkinson power combiner/dividers can also be constructed in a waveguide format, a substrate integrated waveguide (SIW) format, and a micro-coaxial line format. Further, traditional multi-stage Wilkinson divider/combiners are used for wideband application. For example, a two-stage Wilkinson divider/combiner can be implemented with a first stage structured as a low pass network and a second stage structured as low pass network. In each stage, inductors are arranged along two paths with capacitors arranged coupling the paths to ground or some reference. A two-stage Wilkinson divider/combiner can be implemented with a first stage structured as a high pass network and a second stage structured as high pass network. In each stage, capacitors are arranged along two paths with inductors arranged coupling the paths to ground or some reference. A two-stage Wilkinson divider/combiner can be implemented as a low pass/high pass network with one stage structured as a low pass network and the other stage structured as a high pass network. In the low pass stage, inductors are arranged along the two paths with capacitors arranged coupling the paths to ground or some reference, and in the high pass stage, capacitors are arranged along the two paths with inductors arranged coupling the paths to ground or some reference.

SUMMARY OF THE DISCLOSURE

A power combiner/divider circuit can be structured having a base structure with the addition of an odd-mode capacitor and a low pass network at an end of the base structure or structured having a base structure with the addition of an inductor and a high pass network at an end of the base structure. The power combiner/divider circuit can be implemented as a port coupled to multiple ports with low pass networks or the high pass networks arranged at the ends of paths to the multiple ports. In embodiments using low pass base structures or low pass networks coupled to the base structures, inductors in such low pass sections can be positively coupled on a pair-wise basis.

For example, a power combiner/divider circuit can be provided that can comprise: a first path of the combiner/divider circuit from a first port to a second port; a second path of the combiner/divider circuit from the first port to a third port; an isolation resistance coupling the first path to the second path; a first capacitor parallel to the isolation resistance, the first capacitor coupling the first path to the second path, or an inductor parallel to the isolation resistance, the inductor coupling the first path to the second path; and a low pass network coupling the first capacitor to the second port and the third port, with the first capacitor and the low pass network arranged between the isolation resistance and the second and third ports, or a high pass network coupling the inductor to the second port and the third port, with the inductor and the high pass network arranged between the isolation resistance and the second and third ports.

A method of operating a device having a combiner/divider circuit can be provided that can comprise: combining multiple signals or dividing a signal using a combiner/divider circuit, the combiner/divider circuit having an odd-mode capacitor and a low pass network coupled between an isolation resistance of the combiner/divider circuit and two ports of the combiner/divider circuit.

In various embodiments, a device for operation of multiple signals is provided that can comprise: a means for combining multiple signals or dividing a signal; a means for isolation in the combining of the multiple signals or dividing of the signal; an odd-mode capacitor parallel to the means for isolation; and a means for low pass processing coupled between the odd-mode capacitor and two ports of the means for combining or dividing.

BRIEF DESCRIPTION OF THE DRAWINGS

The drawings, which are not necessarily drawn to scale, illustrate generally, by way of example, but not by way of limitation, various embodiments discussed in the present disclosure.

DETAILED DESCRIPTION

The following are example embodiments of power combiner/divider circuits and methods, in accordance with the teachings herein.

Power combiner/divider circuits can be designed with respect to a number of parameters. Parameters to take into consideration include, for example, insertion loss, bandwidth, isolation, size, and power handling. Insertion loss includes effects of metal loss and dielectric loss. The metal loss due to metal thickness at direct current (DC) operation and due to skin effect at alternating current (AC) is the main cause for insertion loss. Bandwidth and isolation parameters are design dependent. Isolation design is related to signals on different paths not influencing each other. A good reflection coefficient for a power combiner/divider circuit can be implemented with terminals of the power combiner/divider circuit being well matched such that there is no reflection, which results in lowering insertion loss. Power handling includes effects associated with the substrate on which the power combiner/divider circuit is implemented, resistor material of the power combiner/divider circuit, and thermal management. In addition, smaller size for a power combiner/divider circuits can result in lower cost.

Given these parameters, there are a number of design concerns. Lumped element implementation is usually used at lower frequency applications due to reduced size than distributed implementation in integrated circuits. At lower frequency range, a low pass structure is more desired than a high pass structure because of smaller inductance needed. As a result, reducing inductor values for lumped element implementation of a power combiner/divider circuit will reduce insertion loss and circuit size. Further, smaller circuit size will reduce cost and provide for ease of integration.

In various embodiments, power combiner/divider circuits, arranged with a first port from which paths are coupled to multiple ports with an isolation resistance coupling the paths, can be structured with a capacitor and a low pass network arranged between the multiple ports on a pair-wise basis. A resistance in the various circuit structures, discussed herein, can be implemented in a number of different ways. A resistance can be realized as a passive device such as a resistor or as an inactive device with the active device arranged in the circuit such that in operation the active device operates as a resistor in the circuit. Utilizing this structural technique, a lower insertion loss and a smaller size can be attained compared to conventional approaches.

Figure 1:
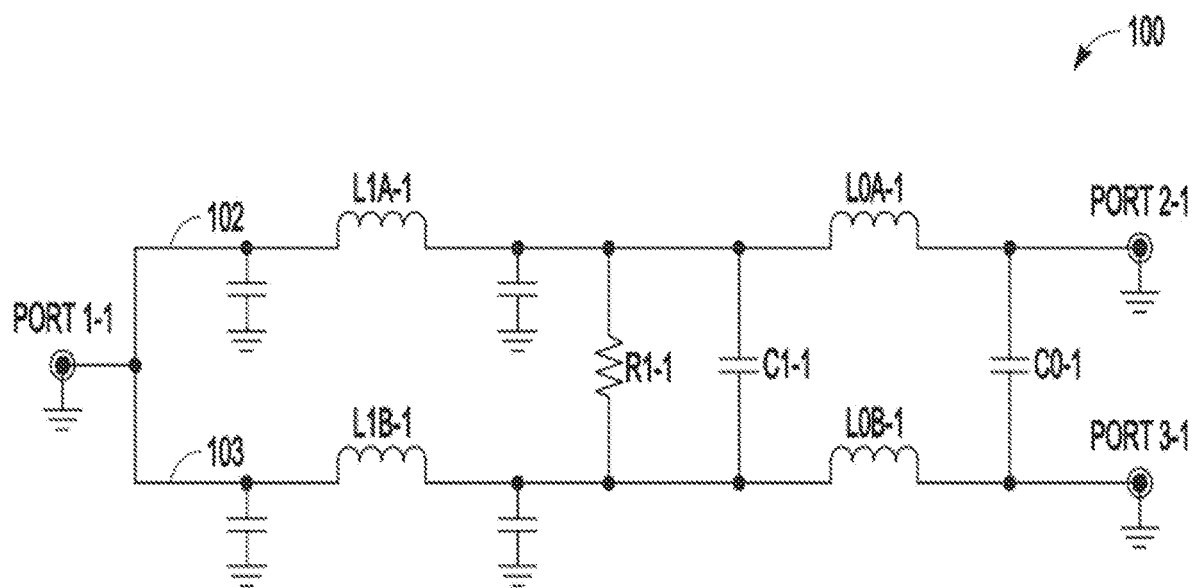
FIG. 1 is a schematic of an embodiment of an example 1.5 section power combiner/divider circuit, according to various embodiments.

FIG. 1 is a schematic of an embodiment of an example 1.5 section power combiner/divider circuit 100. Power combiner/divider circuit 100 can be structured as a base structure, providing section 1, with addition of an odd-mode capacitor and a low pass network, providing a 0.5 section. A nomenclature of a N+0.5 section can used herein with respect to embodiments using a number N of base structures with addition of an odd-mode capacitor and a low pass network or an added inductor and a high pass network, which may depend on the base structure. A power divider/combiner is typically analyzed by odd-mode and even mode operation. At even mode operation, a capacitor and resistor coupling two paths of the power divider/combiner effectively are not visible by the signal and can be equivalent to being non-existent. Such capacitors and resistors only function in odd-mode operation. Hence, a capacitor coupling two signal paths in a power divider/combiner can be referred to as an odd-mode capacitor.

The base structure can include a first path 102 from a first port 1-1 to a second port 2-1 and a second path 103 from first port 1-1 to a third port 3-1 with an isolation resistance R1-1 coupling first path 102 to second path 103. The base structure can include an inductor L1A-1 along first path 102 between first port 1-1 and isolation resistance R1-1 and an inductor L1B-1 along second path 103 between first port 1-1 and isolation resistance R1-1. Capacitors couple first path 102 and second path 103 to ground or other reference. First port 1-1, second port 2-1, and third port 3-1 can be coupled to ground or other reference.

The odd-mode capacitor is capacitor C1-1, which is parallel to isolation resistance R1-1, and couples first path 102 to second path 103. The low pass network can include inductor L0A-1, inductor L0B-1, and capacitor C0-1. Capacitor C0-1 can be coupled to second port 2-1 and third port 3-1. Capacitor C1-1 can be coupled to inductor L0A-1 and to inductor L0B-1, where capacitor C0-1 can couple inductor L0A-1 to inductor L0B-1 with inductor L0A-1 and inductor L0B-1 separating C0-1 from C1-1. The low pass network couples capacitor C1-1 to second port 2-1 and third port 3-1, with capacitor C1-1 and the low pass network arranged between isolation resistance R1-1 and second port 2-1 and third port 3-1. Addition of the odd-mode capacitor and the low pass network can be implemented to extend the isolation bandwidth and reduce insertion loss of each path.

With low pass network (L0A-1, L0B-1, and C0-1) added to second port 2-1 and third port 3-1, two results can occur. First, a wider isolation bandwidth can be provided than a single-section combiner. Second, smaller inductors than for a conventional 2-section combiner can be used, to reduce insertion loss of each path. The combiner/divider circuit 100 shown in FIG. 1 can be considered as 1.5 section combiner/divider circuit with respect to the base structure. The resistance, capacitors, and the inductors of power combiner/divider circuit 100 can be selected such that the ports of power combiner/divider circuit 100 are matched to an acceptable level.

Figure 2:
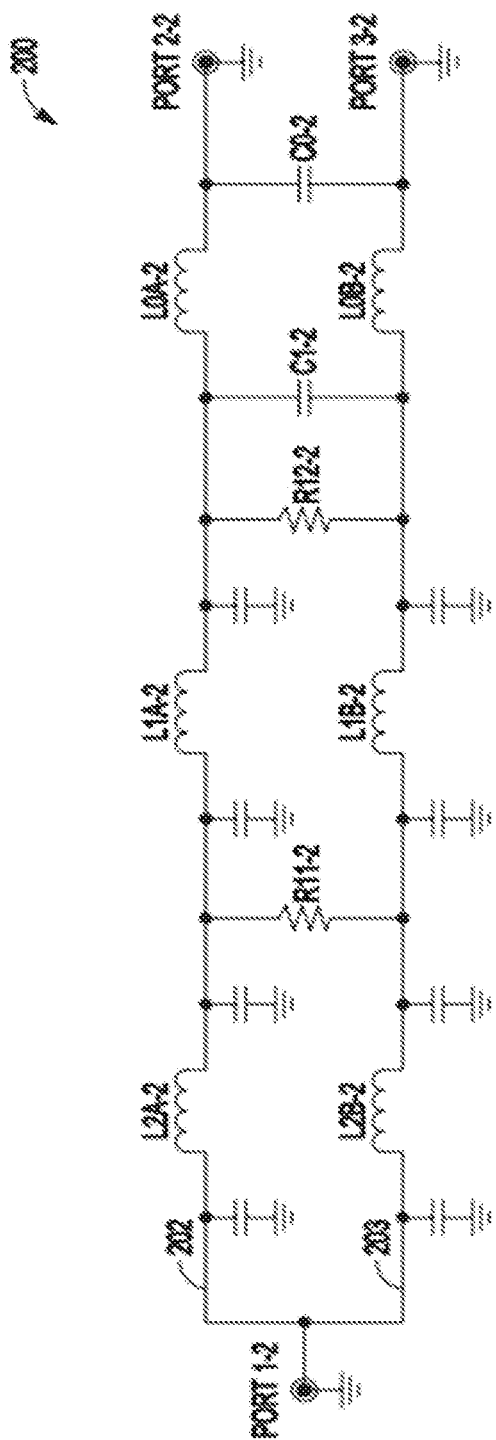
FIG. 2 is a schematic of an example 2.5 section power combiner/divider circuit having multiple stages, according to various embodiments.

FIG. 2 is a schematic of an embodiment of an example 2.5 section power combiner/divider circuit 200 having multiple stages. In the example embodiment of FIG. 2, power combiner/divider circuit 200 can be structured with two base structures, providing 2 sections, with addition of an odd-mode capacitor and a low pass network at an end of a concatenation of the two base structures, providing a 0.5 section. A power combiner/divider circuit can be structured with more than two base structures with addition of an odd-mode capacitor and a low pass network at an end of a concatenation of the multiple base structures. In power combiner/divider circuit 200, the first base structure can include a first path 202 from a first port 1-2 to the second base structure, where first path 202 extends from the second base structure to a second port 2-2. The first base structure also includes a second path 203 from first port 1-2 to the second base structure, where second path 203 extends from the second base structure to a third port 3-2. An isolation resistance R11-2 of the first base structure couples first path 202 to second path 203. An inductor L2A-2 of the first base structure is arranged along path 202 between first port 1-2 and isolation resistance R11-2 with an inductor L2B-2 arranged along path 203 between first port 1-2 and isolation resistance R11-2.

In power combiner/divider circuit 200, the second base structure can include first path 202 from isolation resistance R11-2 of the first base structure to an isolation resistance R12-2 of the second base structure. The second base structure also can include second path 203 from isolation resistance R11-2 of the first base structure to isolation resistance R12-2 of the second base structure. Isolation resistance R12-2 of the second base structure couples first path 202 to second path 203. The second base structure further includes an inductor L1A-2 arranged along path 202 between isolation resistance R11-2 of the first base structure and isolation resistance R12-2 with an inductor L1B-2 arranged along path 203 between isolation resistance R11-2 of the first base structure to isolation resistance R12-2.

Capacitors in the first base structure couple first path 202 and second path 203 to ground or other reference. Capacitors in the second base structure also couple first path 202 and second path 203 to ground or other reference. First port 1-2, second port 2-2, and third port 3-2 can be coupled to ground or other reference.

The odd-mode capacitor is capacitor C1-2, which is parallel to isolation resistance R12-2 of the second base structure and couples first path 202 to second path 203. The low pass network can include inductor L0A-2, inductor L0B-2, and capacitor C0-2. Capacitor C0-2 can be coupled to second port 2-2 and third port 3-2. Capacitor C1-2 can be coupled to inductor L0A-2 and to inductor L0B-2, where capacitor C0-2 can couple inductor L0A-2 to inductor L0B-2 with inductor L0A-2 and inductor L0B-2 separating C0-2 from C1-2. The low pass network couples capacitor C1-2 to second port 2-2 and third port 3-2, with capacitor C1-2 and the low pass network arranged between isolation resistance R12-2 of the second base structure and second port 2-2 and third port 3-2. As with power combiner/divider circuit 100 of FIG. 1, addition of the odd-mode capacitor and the low pass network in power combiner/divider circuit 200 can be implemented to extend the isolation bandwidth and reduce insertion loss of each path.

The approach of power combiner/divider circuit 100 of FIG. 1 can be extended to an N.5 section two-way power combiner/divider circuit, where N is a positive integer referring to the number of base structures of such a power combiner/divider circuit with "0.5" referring to an odd-mode capacitor and a low pass network at an end of a concatenation of the N base structures. Two-way refers to two output ports when used as a divider, where these two output ports are input ports when used as a combiner. N-way refers to N output ports when used as a divider, where these N output ports are input ports when used as a combiner. Thus, power combiner/divider circuit 200 of FIG. 2 is a 2.5 section two-way power combiner/divider circuit. The resistance, capacitors, and the inductors of power combiner/divider circuit 200 can be selected such that the ports of power combiner/divider circuit 200 are matched to an acceptable level.

Figure 3:
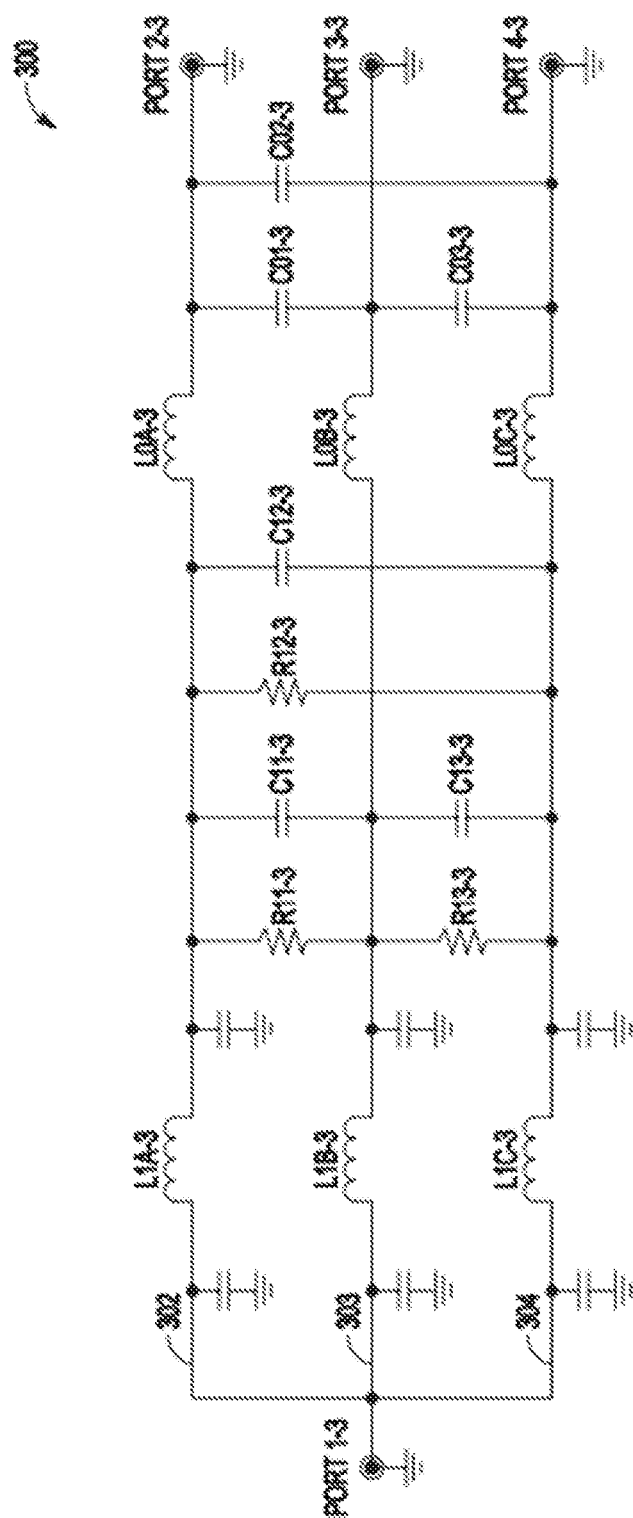
FIG. 3 is a schematic of an example N-way power combiner/divider circuit, according to various embodiments.

FIG. 3 is a schematic of an embodiment of an example N-way power combiner/divider circuit. The approach of power combiner/divider circuit 100 of FIG. 1 can be extended to a N-way power combiner/divider circuit. Though power combiner/divider circuit 300 of FIG. 3 is shown as a 3-way power combiner/divider circuit, a N-way power combiner/divider circuit is not limited to a 3-way configuration. Power combiner/divider circuit 300 can be viewed as having three base structures, each associated with two of the three output/input ports of power combiner/divider circuit 300, and each associated with a different combination of odd-mode capacitor and low pass network. In this view, a second port 2-3 and a third port 3-3 can be associated with a first base structure, second port 2-3 and a fourth port 4-3 can be associated with a second base structure, and third port 3-3 and fourth port 4-3 can be associated with a third base structure, where a first port 1-3 is associated with each base structure. Extending this approach to a N-way power combiner/divider circuit, the N-way power combiner/divider circuit can have an associated N base structures and N combinations of odd-mode capacitor and low pass network.

In power combiner/divider circuit 300, the first base structure, associated with second port 2-3 and third port 3-3, can include a first path 302 from first port 1-3 to second port 2-3 and a second path 303 from first port 1-3 to third port 3-3 with an isolation resistance R11-3 coupling first path 302 to second path 303. The first base structure can include an inductor L1A-3 along first path 302 between first port 1-3 and isolation resistance R11-3 and an inductor L1B-3 along second path 303 between first port 1-3 and isolation resistance R11-3. Capacitors couple first path 302 and second path 303 to ground or other reference. First port 1-3, second port 2-3, and third port 3-3 are coupled to ground or other reference.

The odd-mode capacitor for the first base structure is capacitor C11-3, which is parallel to isolation resistance R11-3 and couples first path 302 to second path 303. The low pass network for the first base structure can include inductor L0A-3, inductor L0B-3, and capacitor C01-3. Capacitor C01-3 can be coupled to second port 2-3 and third port 3-3. Capacitor C11-3 can be coupled to inductor L0A-3 and to inductor L0B-3, where capacitor C01-3 can couple inductor L0A-3 to inductor L0B-3 with inductor L0A-3 and inductor L0B-3 separating C01-3 from C11-3. The low pass network couples capacitor C11-3 to second port 2-3 and third port 3-3, with capacitor C11-3 and the low pass network arranged between isolation resistance R11-3 and second port 2-3 and third port 3-3.

In power combiner/divider circuit 300, the second base structure, associated with second port 2-3 and fourth port 4-3, can include first path 302 from first port 1-3 to second port 2-3 and a third path 304 from first port 1-3 to fourth port 4-3 with an isolation resistance R12-3 coupling first path 302 to third path 304. The second base structure can include an inductor L1A-3 along first path 302 between first port 1-3 and isolation resistance R12-3 and an inductor L1C-3 along third path 304 between first port 1-3 and isolation resistance R12-3. Capacitors couple first path 302 and third path 304 to ground or other reference. First port 1-3, second port 2-3, and fourth port 4-3 are coupled to ground or other reference.

The odd-mode capacitor for the second base structure is capacitor C12-3, which is parallel to isolation resistance R12-3 and couples first path 302 to third path 304. The low pass network for the second base structure can include inductor L0A-3, inductor L0C-3, and capacitor C02-3. Capacitor C02-3 can be coupled to second port 2-3 and fourth port 4-3. Capacitor C12-3 can be coupled to inductor L0A-3 and to inductor L0C-3, where capacitor C02-3 can couple inductor L0A-3 to inductor L0C-3 with inductor L0A-3 and inductor L0C-3 separating C02-3 from C12-3. The low pass network couples capacitor C12-3 to second port 2-3 and fourth port 4-3, with capacitor C12-3 and the low pass network arranged between isolation resistance R12-3 and second port 2-3 and fourth port 4-3.

In power combiner/divider circuit 300, the third base structure, associated with third port 3-3 and fourth port 4-3, can include second path 303 from first port 1-3 to third port 3-3 and third path 304 from first port 1-3 to fourth port 4-3 with an isolation resistance R13-3 coupling second path 303 to third path 304. The third base structure can include inductor L1B-3 along second path 303 between first port 1-3 and isolation resistance R13-3 and an inductor L1C-3 along third path 304 between first port 1-3 and isolation resistance R13-3. Capacitors couple first path 302 and third path 304 to ground or other reference. First port 1-3, third port 3-3, and fourth port 4-3 are coupled to ground or other reference.

The odd-mode capacitor for the third base structure is capacitor C13-3, which is parallel to isolation resistance R13-3 and couples second path 303 to third path 304. The low pass network for the third base structure can include inductor L0B-3, inductor L0C-3, and capacitor C03-3. Capacitor C03-3 can be coupled to third port 3-3 and fourth port 4-3. Capacitor C13-3 can be coupled to inductor L0B-3 and to inductor L0C-3, where capacitor C03-3 can couple inductor L0B-3 to inductor L0C-3 with inductor L0B-3 and inductor L0C-3 separating capacitor C03-3 from capacitor C13-3. The low pass network couples capacitor C13-3 to third port 3-3 and fourth port 4-3, with capacitor C13-3 and the low pass network arranged between isolation resistance R13-3 and third port 3-3 and fourth port 4-3.

With power combiner/divider circuit 300 viewed as having three base structures, the low pass network for the first base structure and the low pass network for the second base structure share inductor L0A-3 coupled to second port 2-3. The low pass network for the second base structure and the low pass network for the third base structure share inductor L0C-3 coupled to fourth port 4-3. The low pass network for the first base structure and the low pass network for the third base structure share inductor L0B-3 coupled to third port 3-3. The first base structure and the second base structure share inductor L1A-3 in their base structures. The second base structure and the third base structure share inductor L1C-3 in their base structures. The first base structure and the third base structure share inductor L1B-3 in their base structures. The resistance, capacitors, and the inductors of power combiner/divider circuit 300 can be selected such that the ports of power combiner/divider circuit 300 are matched to an acceptable level.

Figure 4:
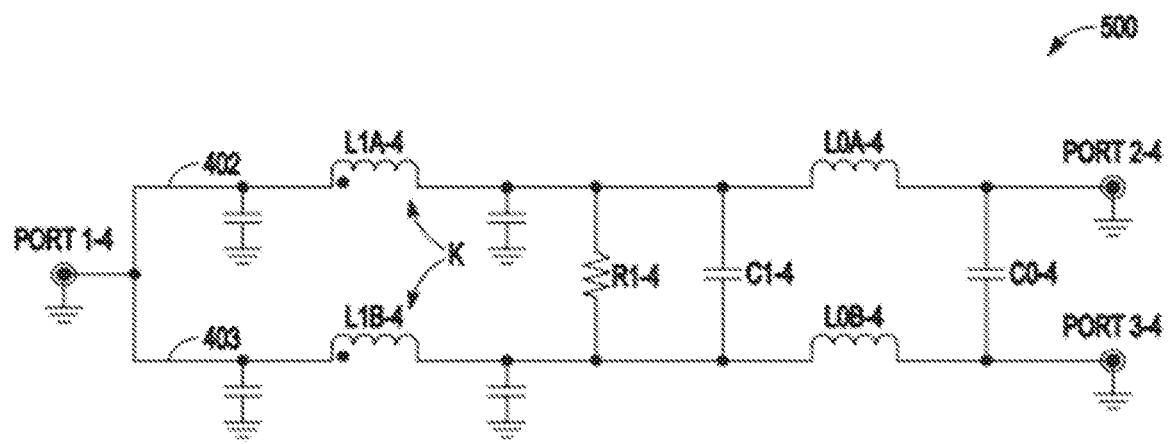
FIG. 4 is a schematic of an example 1.5 section 2-way power combiner/divider circuit with positively coupled inductors, according to various embodiments.

FIG. 4 is a schematic of an embodiment of an example 1.5 section 2-way power combiner/divider circuit 400 with positively coupled inductors. FIG. 4 can be implemented, similar to FIG. 1, having inductors L1A-4 and L1B-4 structured as positively coupled in pairs. Two inductors are positively coupled when a magnetic field in one inductor affects the magnetic field in the other inductor. The strength of the coupling is defined by a coupling coefficient K, which is a value between 1 (perfectly linked inductors) and 0 (uncoupled inductors). Positively coupled inductors are coupled inductors arranged such that as induced voltage increases or decreases in one inductor, so does induced voltage in the other inductor in the same direction. Positively coupling can result in smaller layout size and smaller insertion loss.

Power combiner/divider circuit 400 can be structured as a base structure with addition of an odd-mode capacitor and a low pass network. The base structure can include a first path 402 from a first port 1-4 to a second port 2-4 and a second path 403 from first port 1-4 to a third port 3-4 with an isolation resistance R1-4 coupling first path 402 to second path 403. The base structure can include an inductor L1A-4 along path 402 between first port 1-4 and isolation resistance R1-4 and an inductor L1B-4 along path 403 between first port 1-4 and isolation resistance R1-4. Inductor L1A-4 and inductor L1B-4 are coupled inductors having coupling coefficient K. Inductor L1A-4 and inductor L1B-4 can be positively coupled inductors. Capacitors couple first path 402 and second path 403 to ground or other reference. First port 1-4, second port 2-4, and third port 3-4 are coupled to ground or other reference.

The odd-mode capacitor is capacitor C1-4, which is parallel to isolation resistance R1-4, and couples first path 402 to second path 403. The low pass network can include inductor L0A-4, inductor L0B-4, and capacitor C0-4. Capacitor C0-4 can be coupled to second port 2-4 and third port 3-4. Capacitor C1-4 can be coupled to inductor L0A-4 and to inductor L0B-4, where capacitor C0-4 can couple inductor L0A-4 to inductor L0B-4 with inductor L0A-4 and inductor L0B-4 separating C0-4 from C1-4. The low pass network couples capacitor C1-4 to second port 2-4 and third port 3-4, with capacitor C1-4 and the low pass network arranged between isolation resistance R1-4 and second port 2-4 and third port 3-4. Addition of the odd-mode capacitor and the low pass network can be implemented to extend the isolation bandwidth and reduce insertion loss of each path. The resistance, capacitors, and the inductors of power combiner/divider circuit 400 can be selected such that the ports of power combiner/divider circuit 400 are matched to an acceptable level.

Inductors L1A-4 and L1B-4 will enhance the inductance with each other through mutual coupling. Positively coupled inductors L1A-4 and L1B-4 have a larger equivalent inductance than individual inductors L1A-4 and L1B-4 without coupling. Hence, positively coupled inductors L1A-4 and L1B-4 can be physically smaller and have less metal loss, which results in lower insertion loss. Due to the coupling, inductors L1A-4 and L1B-4 can be placed close to each other, which results in further size reduction for power combiner/divider circuit 400 relative to power combiner/divider circuits without using inductors having mutual coupling.

Figure 5:
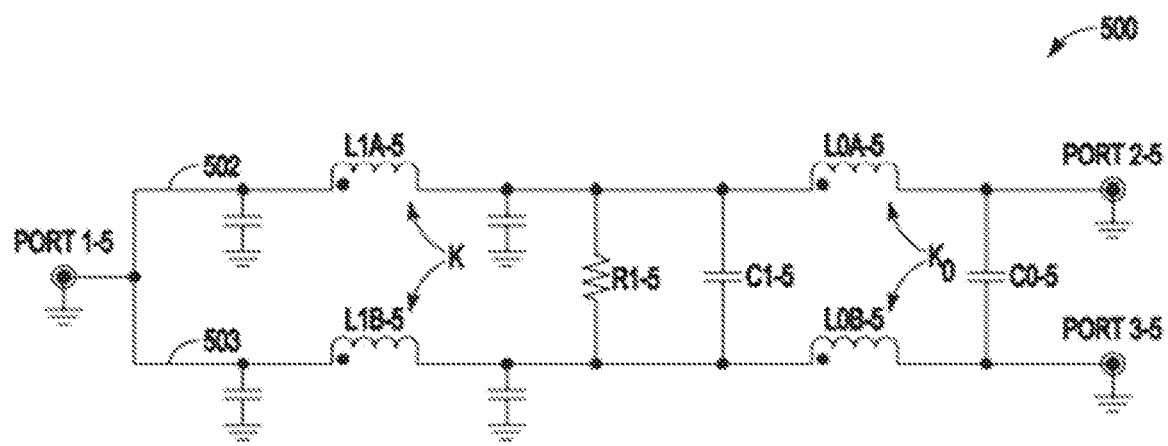
FIG. 5 is a schematic of an example 1.5 section 2-way power combiner/divider circuit with positively coupled inductors in a base structure and positively coupled inductors in a low pass network, according to various embodiments.

FIG. 5 is a schematic of an embodiment of an example 1.5 section 2-way power combiner/divider circuit 500 with positively coupled inductors in a base structure and positively coupled inductors in a low pass network. Power combiner/divider circuit 500 is similar to power combiner/divider circuit 400 of FIG. 4, except the low pass network of the 1.5 section uses positively coupled inductors that are not used in power combiner/divider circuit 400. Positively coupling all the inductors in a pair-wise manner in a 1.5 section 2-way power combiner/divider circuit, such as power combiner/divider circuit 500 shown in FIG. 5, can result in smaller layout size and smaller insertion loss.

Power combiner/divider circuit 500 can be structured as a base structure with addition of an odd-mode capacitor and a low pass network. The base structure can include a first path 502 from a first port 1-5 to a second port 2-5 and a second path 503 from first port 1-5 to a third port 3-5 with an isolation resistance R1-5 coupling first path 502 to second path 503. The base structure can include an inductor L1A-5 along path 502 between first port 1-5 and isolation resistance R1-5 and an inductor L1B-5 along path 503 between first port 1-5 and isolation resistance R1-5. Inductor L1A-5 and inductor L1B-5 are coupled inductors having coupling coefficient K. Inductor L1A-5 and inductor L1B-5 can be positively coupled inductors. Capacitors couple first path 502 and second path 503 to ground or other reference. First port 1-5, second port 2-5, and third port 3-5 are coupled to ground or other reference.

The odd-mode capacitor is capacitor C1-5, which is parallel to isolation resistance R1-5, and couples first path 502 to second path 503. The low pass network can include an inductor L0A-5, an inductor L0B-5, and a capacitor C0-5. Inductor L0A-5 and inductor L0B-5 are coupled inductors having coupling coefficient $K_O$. Inductor L0A-5 and inductor L0B-5 can be positively coupled inductors. Coupled inductors L0A-5 and inductor L0B-5 can be implemented with no coupling with coupled inductors L1A-5 and inductor L1B-5. Capacitor C0-5 can be coupled to second port 2-5 and third port 3-5. Capacitor C1-5 can be coupled to inductor L0A-5 and to inductor L0B-5, where capacitor C0-5 can couple inductor L0A-5 to inductor L0B-5 with inductor L0A-5 and inductor L0B-5 separating C0-5 from C1-5. The low pass network couples capacitor C1-5 to second port 2-5 and third port 3-5, with capacitor C1-5 and the low pass network arranged between isolation resistance R1-5 and second port 2-5 and third port 3-5. Addition of the odd-mode capacitor and the low pass network can be implemented to extend the isolation bandwidth and reduce insertion loss of each path.

Inductors L1A-5 and L1B-5 will enhance the inductance with each other through mutual coupling. Likewise, inductors L0A-5 and L0B-5 will enhance the inductance with each other through mutual coupling. Positively coupled inductors L1A-5 and L1B-5 have a larger equivalent inductance than individual inductors L1A-5 and L1B-5 without coupling. Likewise, positively coupled inductors L0A-5 and L0B-5 have a larger equivalent inductance than individual inductors L0A-5 and L0B-5 without coupling. Hence, positively coupled inductors L1A-5 and L1B-5 and positively coupled inductors L0A-5 and L0B-5 can be physically smaller and have less metal loss, which results in lower insertion loss. Due to the coupling, positively coupled inductors L1A-5 and L1B-5 can be placed close to each other and positively coupled inductors L0A-5 and L0B-5 can be placed close to each other, which results in further size reduction for power combiner/divider circuit 500 relative to power combiner/divider circuits without using inductors having mutual coupling or power combiner/divider circuits using inductors having mutual coupling only in the base structure of the 1.5 section power combiner/divider circuit. The resistance, capacitors, and the inductors of power combiner/divider circuit 500 can be selected such that the ports of power combiner/divider circuit 500 are matched to an acceptable level.

Figure 6:
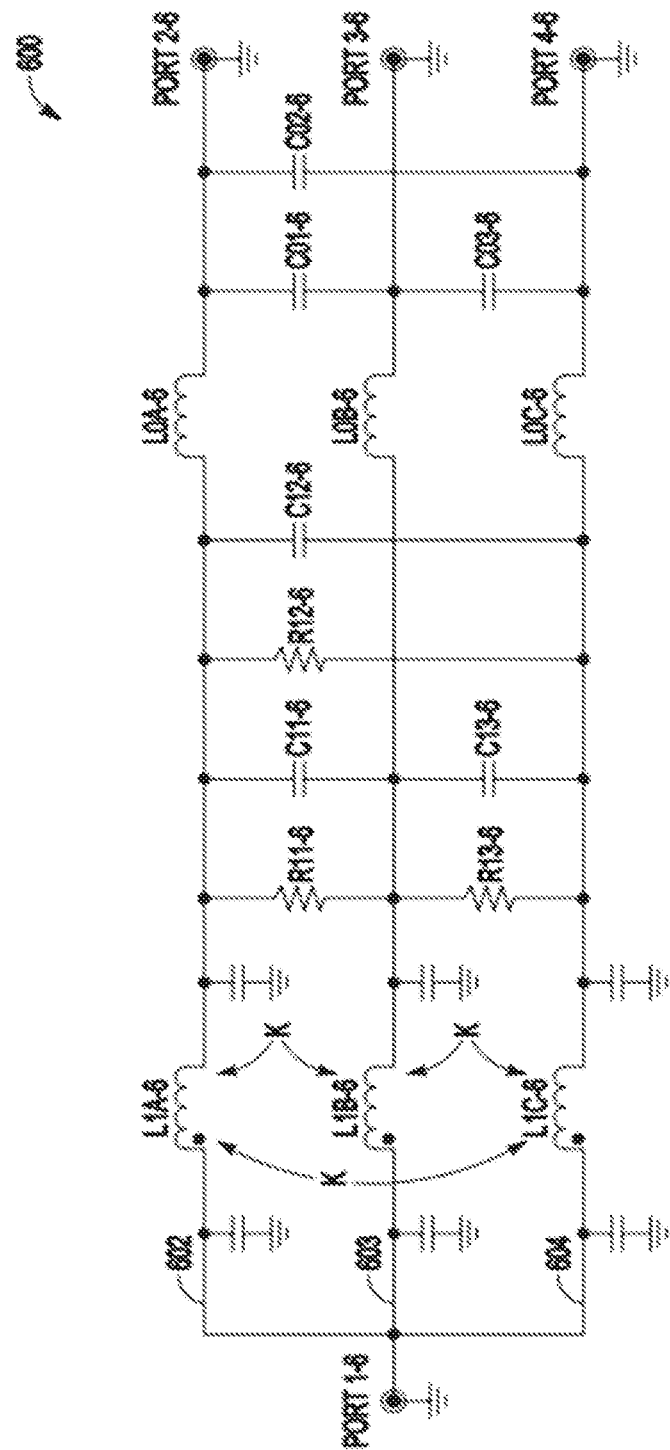
FIG. 6 is a schematic of an example 1.5 section 3-way power combiner/divider circuit with positively coupled inductors in section one of the 1.5 section 3-way combiner/divider, according to various embodiments.

FIG. 6 is a schematic of an embodiment of an example 1.5 section 3-way combiner/divider circuit 600 with positively coupled inductors in section 1 of 1.5 section 3-way combiner/divider circuit 600. The implementation of coupled inductors in base structures of a power combiner/divider circuit, as discussed with respect to example 1.5 section 2-way power combiner/divider circuit 400 of FIG. 4, can be extended to a N-way combiner/divider circuit and is not limited to a 3-way combiner/divider circuit 600 as shown in FIG. 6.

Power combiner/divider circuit 600 can be viewed as having three base structures, each associated with two of the three output/input ports of power combiner/divider circuit 600, and each associated with a different combination of odd-mode capacitor and low pass network. In this view, a second port 2-6 and a third port 3-6 can be associated with a first base structure, second port 2-6 and a fourth port 4-6 can be associated with a second base structure, and third port 3-6 and fourth port 4-6 can be associated with a third base structure, where a first port 1-6 is associated with each base structure. Extending this approach to a N-way power combiner/divider circuit, the N-way power combiner/divider circuit can have associated N base structures and N combinations of odd-mode capacitor and low pass network.

In power combiner/divider circuit 600, the first base structure, associated with second port 2-6 and third port 3-6, can include a first path 602 from first port 1-6 to second port 2-6 and a second path 603 from first port 1-6 to third port 3-6 with an isolation resistance R11-6 coupling first path 602 to second path 603. The first base structure can include an inductor L1A-6 along first path 602 between first port 1-6 and isolation resistance R11-6 and an inductor L1B-6 along second path 603 between first port 1-6 and isolation resistance R11-6. Inductor L1A-6 and inductor L1B-6 are coupled inductors having coupling coefficient K. Inductor L1A-6 and inductor L1B-6 can be positively coupled inductors. Capacitors couple first path 602 and second path 603 to ground or other reference. First port 1-6, second port 2-6, and third port 3-6 are coupled to ground or other reference.

The odd-mode capacitor for the first base structure is capacitor C11-6, which is parallel to isolation resistance R11-6 and couples first path 602 to second path 603. The low pass network for the first base structure can include inductor L0A-6, inductor L0B-6, and capacitor C01-6. Capacitor C01-6 can be coupled to second port 2-6 and third port 3-6. Capacitor C11-6 can be coupled to inductor L0A-6 and to inductor L0B-6, where capacitor C01-6 can couple inductor L0A-6 to inductor L0B-6 with inductor L0A-6 and inductor L0B-6 separating C01-6 from C13-6. The low pass network couples capacitor C11-6 to second port 2-6 and third port 3-6, with capacitor C11-6 and the low pass network arranged between isolation resistance R11-6 and second port 2-6 and third port 3-6.

In power combiner/divider circuit 600, the second base structure, associated with second port 2-6 and fourth port 4-6, can include first path 602 from first port 1-6 to second port 2-6 and a third path 604 from first port 1-6 to fourth port 4-6 with an isolation resistance R12-6 coupling first path 602 to third path 604. The second base structure can include an inductor L1A-6 along first path 602 between first port 1-6 and isolation resistance R12-6 and an inductor L1C-6 along third path 604 between first port 1-6 and isolation resistance R12-6. Inductor L1A-6 and inductor L1C-6 are coupled inductors having coupling coefficient K. Inductor L1A-6 and inductor L1C-6 can be positively coupled inductors. Capacitors couple first path 602 and third path 604 to ground or other reference. First port 1-6, second port 2-6, and fourth port 4-6 are coupled to ground or other reference.

The odd-mode capacitor for the second base structure is capacitor C12-6, which is parallel to isolation resistance R12-6 and couples first path 602 to third path 604. The low pass network for the second base structure can include inductor L0A-6, inductor L0C-6, and capacitor C02-6.

Capacitor C02-6 can be coupled to second port 2-6 and fourth port 4-6. Capacitor C12-6 can be coupled to inductor L0A-6 and to inductor L0C-6, where capacitor C02-6 can couple inductor L0A-6 to inductor L0C-6 with inductor L0A-6 and inductor L0C-6 separating C02-6 from C12-6. The low pass network couples capacitor C12-6 to second port 2-6 and fourth port 4-6, with capacitor C12-6 and the low pass network arranged between isolation resistance R12-6 and second port 2-6 and fourth port 4-6.

In power combiner/divider circuit 600, the third base structure, associated with third port 3-6 and fourth port 4-6, can include second path 603 from first port 1-6 to third port 3-6 and third path 604 from first port 1-6 to fourth port 4-6 with an isolation resistance R13-6 coupling second path 603 to third path 604. The third base structure can include inductor L1B-6 along second path 603 between first port 1-6 and isolation resistance R13-6 and an inductor L1C-6 along third path 604 between first port 1-6 and isolation resistance R13-6. Inductor L1B-6 and inductor L1C-6 are coupled inductors having coupling coefficient K. Inductor L1B-6 and inductor L1C-6 can be positively coupled inductors. Capacitors couple first path 603 and third path 604 to ground or other reference. First port 1-6, third port 3-6, and fourth port 4-6 are coupled to ground or other reference.

The odd-mode capacitor for the third base structure is capacitor C13-6, which is parallel to isolation resistance R13-6 and couples second path 603 to third path 604. The low pass network for the third base structure can include inductor L0B-6, inductor L0C-6, and capacitor C03-6. Capacitor C03-6 can be coupled to third port 3-6 and fourth port 4-6. Capacitor C13-3 can be coupled to inductor L0B-6 and to inductor L0C-6, where capacitor C03-6 can couple inductor L0B-6 to inductor L0C-6 with inductor L0B-6 and inductor L0C-6 separating capacitor C03-6 from capacitor C13-6. The low pass network couples capacitor C13-6 to third port 3-6 and fourth port 4-6, with capacitor C13-6 and the low pass network arranged between isolation resistance R13-6 and third port 3-6 and fourth port 4-6.

With power combiner/divider circuit 600 viewed as having three base structures, the low pass network for the first base structure and the low pass network for the second base structure share inductor L0A-6 coupled to second port 2-6. The low pass network for the second base structure and the low pass network for the third base structure share inductor L0C-6 coupled to fourth port 4-6. The low pass network for the first base structure and the low pass network for the third base structure share inductor L0B-6 coupled to third port 3-6. The first base structure and the second base structure share inductor L1A-6 in their base structures. The second base structure and the third base structure share inductor L1C-6 in their base structures. The first base structure and the third base structure share inductor L1B-6 in their base structures. The resistance, capacitors, and the inductors of power combiner/divider circuit 600 can be selected such that the ports of power combiner/divider circuit 600 are matched to an acceptable level.

Figure 7:
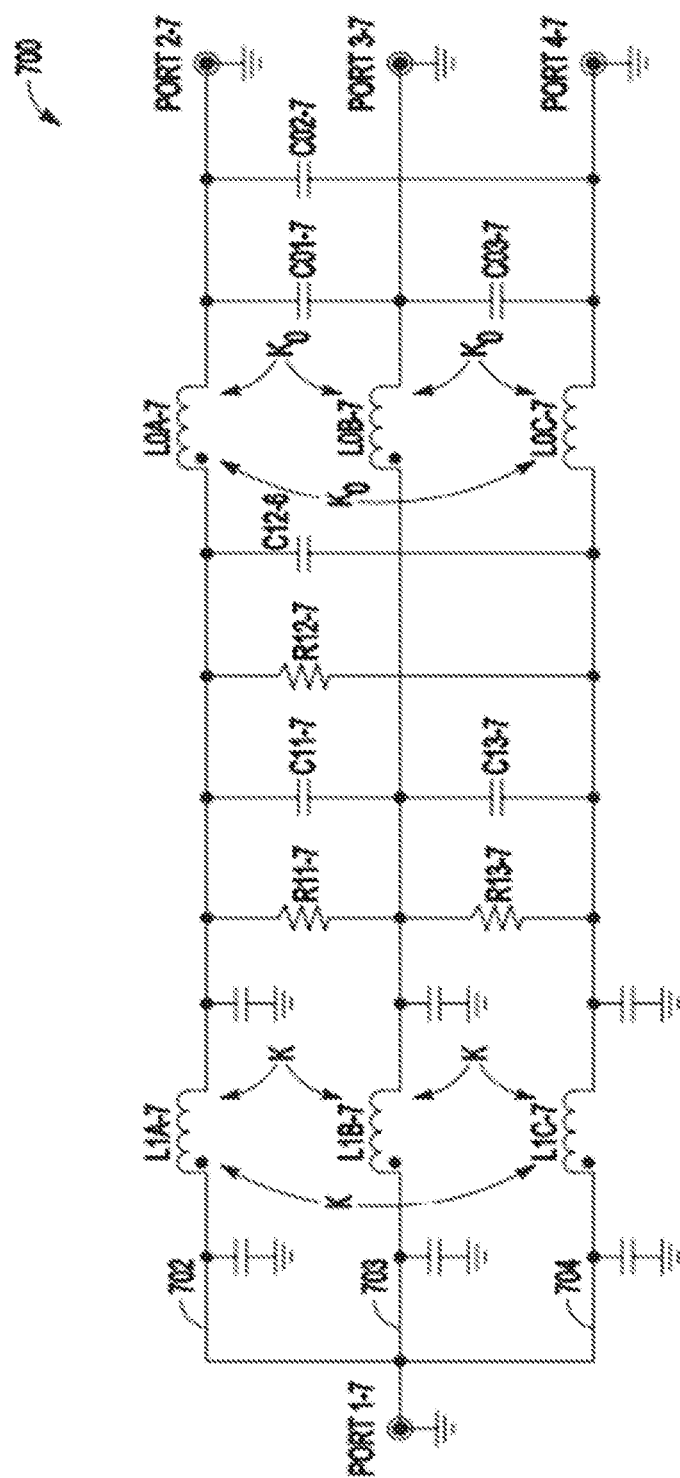
FIG. 7 is a schematic of an example 1.5 section 3-way power combiner/divider circuit with positively coupled inductors in a base section and in a low pass network section, according to various embodiments.

FIG. 7 is a schematic of an embodiment of an example 1.5 section 3-way power combiner/divider circuit 700 with positively coupled inductors in a base section and in a low pass network section. This implementation can be realized by extending the approach of power combiner/divider 500 of FIG. 5 to a N-way combiner/divider. In the example of FIG. 7, a 3-way power combiner/divider circuit 700 is shown in FIG. 7, though the extension is not limited to N=3. Power combiner/divider circuit 700 can include an inductor L1A-7, an inductor L1B-7, and an inductor L1C-7 as positive mutual coupled inductors and can include an inductor L0A-7, an inductor L0B-7, and an inductor L0C-7 as positive mutual coupled inductors. However, power combiner/divider circuit 700 can be implemented with no coupling between L1x-7 and L0x-7 (x=A, B, C) inductors.

Power combiner/divider circuit 700 can be viewed as having three base structures, each associated with two of the three output/input ports of power combiner/divider circuit 700, and each associated with a different combination of odd-mode capacitor and low pass network. In this view, a second port 2-7 and a third port 3-7 can be associated with a first base structure, second port 2-7 and a fourth port 4-7 can be associated with a second base structure, and third port 3-7 and fourth port 4-7 can be associated with a third base structure, where a first port 1-7 is associated with each base structure. Extending this approach to a N-way power combiner/divider circuit, the N-way power combiner/divider circuit can have an associated N base structures and N combinations of odd-mode capacitor and low pass network.

In power combiner/divider circuit 700, the first base structure, associated with second port 2-7 and third port 3-7, can include a first path 702 from first port 1-7 to second port 2-7 and a second path 703 from first port 1-7 to third port 3-7 with an isolation resistance R11-7 coupling first path 702 to second path 703. The first base structure can include inductor L1A-7 along first path 702 between first port 1-7 and isolation resistance R11-7 and inductor L1B-7 along second path 703 between first port 1-7 and isolation resistance R11-7. Inductor L1A-7 and inductor L1B-7 are coupled inductors having coupling coefficient K. Inductor L1A-7 and inductor L1B-7 can be positively coupled inductors. Capacitors couple first path 702 and second path 703 to ground or other reference. First port 1-7, second port 2-7, and third port 3-7 are coupled to ground or other reference.

The odd-mode capacitor for the first base structure is capacitor C11-7, which is parallel to isolation resistance R11-7 and couples first path 702 to second path 703. The low pass network for the first base structure can include inductor L0A-7, inductor L0B-7, and capacitor C01-7. Inductor L0A-7 and inductor L0B-7 are coupled inductors having coupling coefficient $K_0$. Inductor L0A-7 and inductor L0B-7 can be positively coupled inductors. Capacitor C01-7 can be coupled to second port 2-7 and third port 3-7. Capacitor C11-7 can be coupled to inductor L0A-7 and to inductor L0B-7, where capacitor C01-7 can couple inductor L0A-7 to inductor L0B-7 with inductor L0A-7 and inductor L0B-7 separating C01-7 from C11-7. The low pass network couples capacitor C11-7 to second port 2-7 and third port 3-7, with capacitor C11-7 and the low pass network arranged between isolation resistance R11-7 and second port 2-7 and third port 3-7.

In power combiner/divider circuit 700, the second base structure, associated with second port 2-7 and fourth port 4-7, can include first path 702 from first port 1-7 to second port 2-7 and a third path 704 from first port 1-7 to fourth port 4-7 with an isolation resistance R12-7 coupling first path 702 to third path 704. The second base structure can include inductor L1A-7 along first path 702 between first port 1-7 and isolation resistance R12-7 and inductor L1C-7 along third path 704 between first port 1-7 and isolation resistance R12-7. Inductor L1A-7 and inductor L1C-7 are coupled inductors having coupling coefficient K. Inductor L1A-7 and inductor L1C-7 can be positively coupled inductors Capacitors couple first path 702 and third path 704 to ground or other reference. First port 1-7, second port 2-7, and fourth port 4-7 are coupled to ground or other reference.

The odd-mode capacitor for the second base structure is capacitor C12-7, which is parallel to isolation resistance R12-7 and couples first path 702 to third path 704. The low pass network for the second base structure can include inductor L0A-7, inductor L0C-7, and capacitor C02-7. Inductor L0A-7 and inductor L0C-7 are coupled inductors having coupling coefficient K. Inductor L0A-7 and inductor L0C-7 can be positively coupled inductors Capacitor C02-7 can be coupled to second port 2-7 and fourth port 4-7. Capacitor C12-7 can be coupled to inductor L0A-7 and to inductor L0C-7, where capacitor C02-7 can couple inductor L0A-7 to inductor L0C-7 with inductor L0A-7 and inductor L0C-7 separating C02-7 from C12-7. The low pass network couples capacitor C12-7 to second port 2-7 and fourth port 4-7, with capacitor C12-7 and the low pass network arranged between isolation resistance R12-7 and second port 2-7 and fourth port 4-7.

In power combiner/divider circuit 700, the third base structure, associated with third port 3-7 and fourth port 4-7, can include second path 703 from first port 1-7 to third port 3-7 and third path 704 from first port 1-7 to fourth port 4-7 with an isolation resistance R13-7 coupling second path 703 to third path 704. The third base structure can include inductor L1B-7 along second path 703 between first port 1-7 and isolation resistance R13-7 and inductor L1C-7 along third path 704 between first port 1-7 and isolation resistance R13-7. Inductor L1B-7 and inductor L1C-7 are coupled inductors having coupling coefficient K. Inductor L1B-7 and inductor L1C-7 can be positively coupled inductors Capacitors couple first path 702 and third path 704 to ground or other reference. First port 1-7, third port 3-7, and fourth port 4-7 are coupled to ground or other reference.

The odd-mode capacitor for the third base structure is capacitor C13-7, which is parallel to isolation resistance R13-7 and couples second path 703 to third path 704. The low pass network for the third base structure can include inductor L0B-7, inductor L0C-7, and capacitor C03-7. Inductor L0B-7 and inductor L0C-7 are coupled inductors having coupling coefficient K. Inductor L0B-7 and inductor L0C-7 can be positively coupled inductors Capacitor C03-7 can be coupled to third port 3-7 and fourth port 4-7. Capacitor C13-7 can be coupled to inductor L0B-7 and to inductor L0C-7, where capacitor C03-7 can couple inductor L0B-7 to inductor L0C-7 with inductor L0B-7 and inductor L0C-7 separating capacitor C03-7 from capacitor C13-7. The low pass network couples capacitor C13-7 to third port 3-7 and fourth port 4-7, with capacitor C13-7 and the low pass network arranged between isolation resistance R13-7 and third port 3-7 and fourth port 4-7.

With power combiner/divider circuit 700 viewed as having three base structures, the low pass network for the first base structure and the low pass network for the second base structure share inductor L0A-7 coupled to second port 2-7. The low pass network for the second base structure and the low pass network for the third base structure share inductor L0C-7 coupled to fourth port 4-7. The low pass network for the first base structure and the low pass network for the third base structure share inductor L0B-7 coupled to third port 3-7. The first base structure and the second base structure share inductor L1A-7 in their base structures. The second base structure and the third base structure share inductor L1C-7 in their base structures. The first base structure and the third base structure share inductor L1B-7 in their base structures. The resistance, capacitors, and the inductors of power combiner/divider circuit 700 can be selected such that the ports of power combiner/divider circuit 700 are matched to an acceptable level.

Figure 8A:
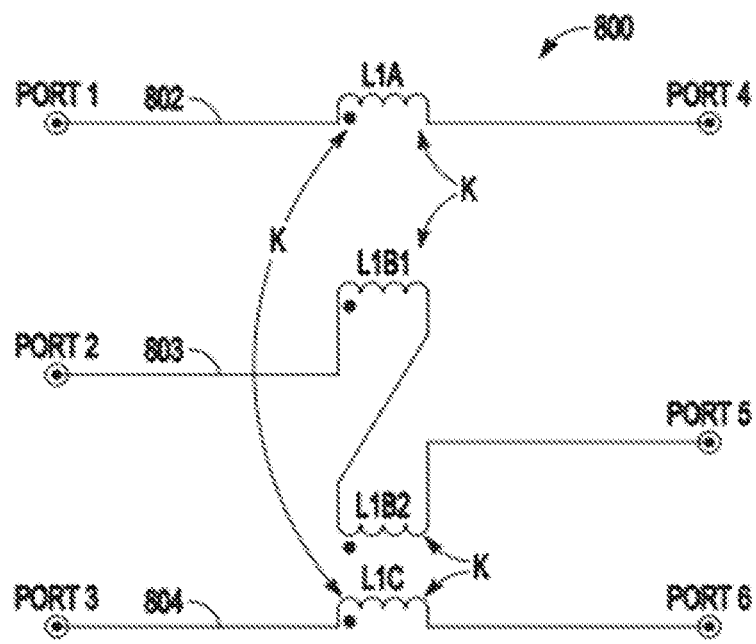
FIGS. 8A-8C illustrate an example layout of three high symmetric mutual coupled inductors, according to various embodiments.
Figure 8B:
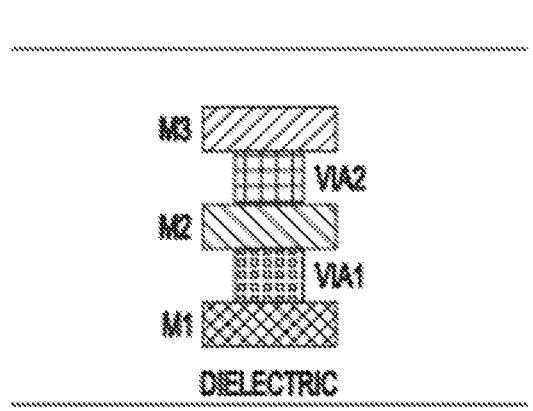

FIGS. 8A-8B illustrate an embodiment of an example layout of three high symmetric mutual coupled inductors. FIG. 8A shows a schematic of an embodiment of an example portion of a 3-way power combiner/divider circuit with inductor L1A implemented on path 802 from port 1 to port 4. Inductor L1C is implemented on a path 804 from port 3 to port 6. An inductor can be structured as an inductor divided into inductor L1B1 and inductor L1B2 on path 803 from port 2 to port 5. Other components of the 3-way power combiner/divider circuit are not shown to focus on the arrangement of the inductors L1A, L1B1, L1B2, and L1C. The inductors L1A and L1B1, L1B2 and L1C, and L1A and L1C are positive mutual coupled inductors. The inductors L1A, L1B1 plus L1B2, and L1C can be implemented to have the same value of inductance.

FIG. 8B illustrates the conductive paths of inductors L1A, L1B1, L1B2, and L1C in a dielectric. The conductive paths can be implemented as metal lines. In FIG. 8B, portions of conductive lines M1, M2, and M3 are shown in vertical arrangement with respect to each other using vias VIA1 and VIA2 in the dielectric to couple between the different vertical levels on the conductive lines are disposed.

Figure 8C:
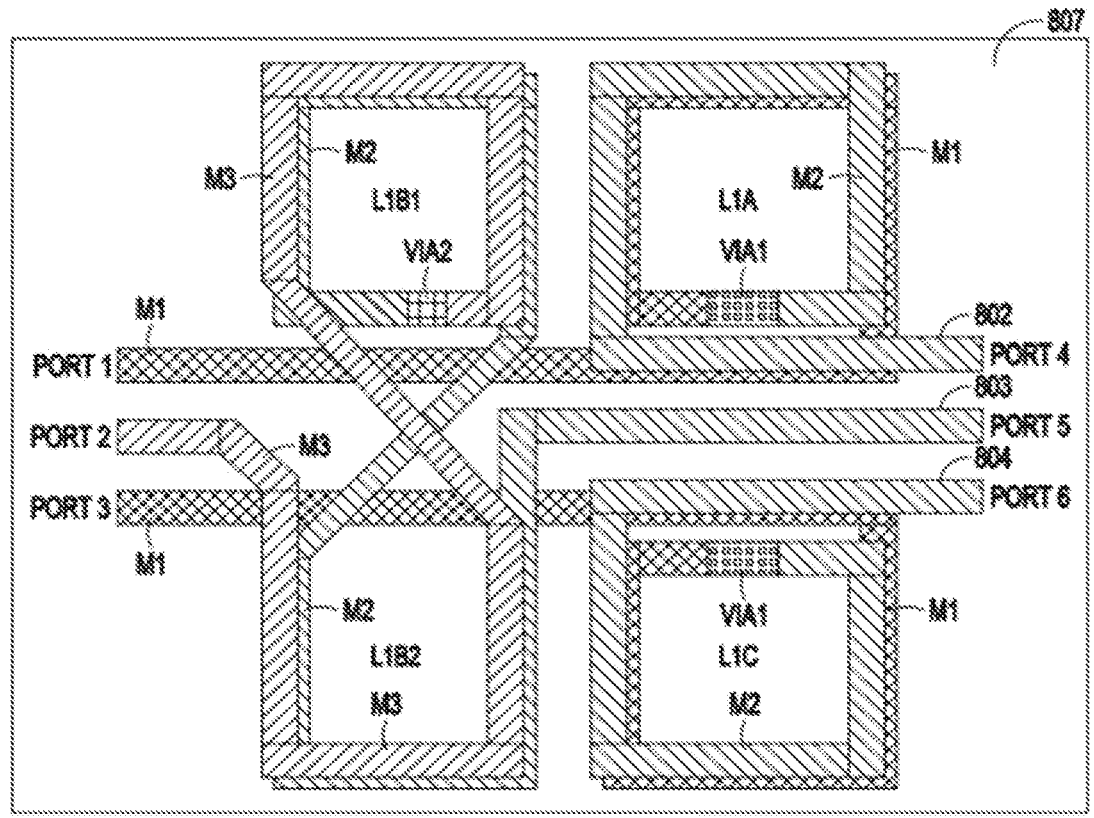

FIG. 8C shows the layout of FIG. 8A on a substrate 807 using the three dimensional design of FIG. 8B. As can be seen in FIG. 8C, this layout can be compact and symmetric. Port 1 is at a lower level coupled to a conductive line M1 and port 3 is at the lower level coupled to another conductive line M1. Port 2 is at an upper level coupled to a conductive line M3. Port 4, port 5, and port 6 are at a middle level coupled to three different conductive lines M2, respectively.

Inductor L1A is coupled to port 1 by conductive line M1 and is coupled, using via VIAL, to conductive line M2 that is coupled to port 4 by conductive line M2. Conductive line M1 is below conductive line M2 in inductor L1A. Conductive line M1 and conductive line M2, using via VIA1, form path 802 from port 1 to port 4. Inductor L1C is coupled to port 3 by the other conductive line M1 and is coupled, using another via VIA1, to a second conductive line M2 that is coupled to port 6 by second conductive line M2. This other conductive line M1 is below second conductive line M2 in inductor L1C. This other conductive line M1 and second conductive line M2, using second via VIAL, form path 804 from port 3 to port 6.

Inductor L1B2 is coupled to port 2 by conductive line M3, which couples to inductor L1B1 that is coupled, using via VIA2, to a third conductive line M2 that is coupled to port 5 by third conductive line M2. Third conductive line M2 is below conductive line M3 in inductor L1B2. Conductive line M3 and third conductive line M2, using second via VIA2, form path 803 from port 3 to port 5. Such a multiple level layout, as shown in FIGS. 8A-8C, can be implemented in other portions of a power combiner/divider circuit.

The example power combiner/divider circuits of FIGS. 1-7 illustrate implementations of power combiner/divider circuits having a low pass base structure concatenated with an additional low pass network. Power combiner/divider circuits of FIGS. 1-3 can be modified to have a high pass base structure concatenated with an additional low pass network by replacing capacitors in the base structures with inductors and replacing the inductors in the base structures with capacitors. Power combiner/divider circuits of FIGS. 1-4 and FIG. 6 can be modified to have a low pass base structure concatenated with an additional high pass network by replacing odd-mode capacitors and capacitors in the additional low pass networks of FIGS. 1-3 with inductors and replacing the inductors in the additional low pass networks with capacitors. Power combiner/divider circuits of FIGS. 1-3 can be modified to have a high pass base structure concatenated with an additional high pass network by replacing all the capacitors in the power combiner/divider circuits of FIGS. 1-3 with inductors and replacing the inductors power combiner/divider circuits of FIGS. 1-3 with capacitors. However, as previously noted, at lower frequency range, a low pass structure is more desired than a high pass structure, because smaller inductance can be used.

Figure 9:
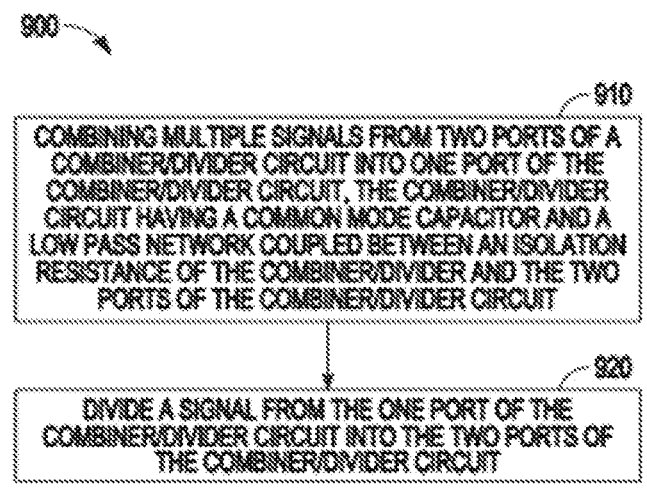
FIG. 9 is a flow diagram of features of an example of a voltage generation method, according to various embodiments.
Figure 10:
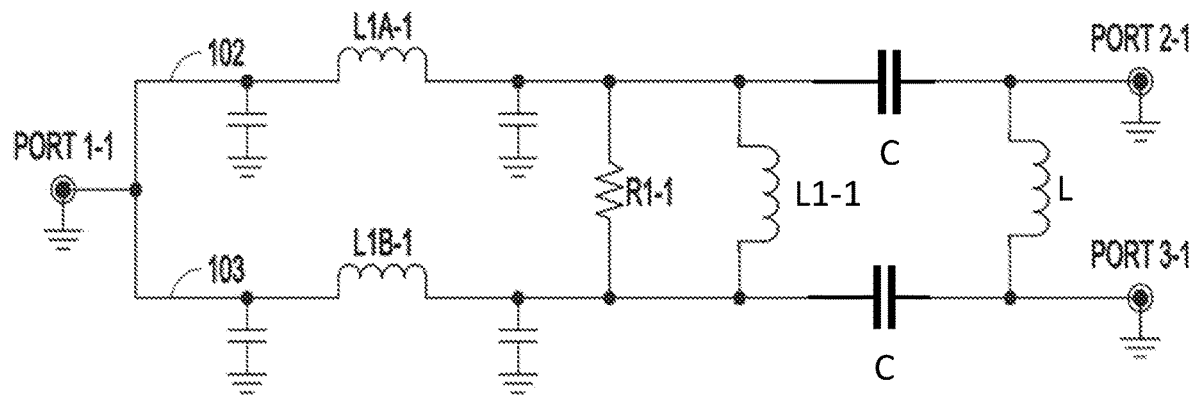
FIG. 10 is a schematic of an embodiment of an example 1.5 section power combiner/divider circuit with an inductor connected in parallel with an isolation resistance, according to various embodiments.

FIG. 9 is a flow diagram of features of an embodiment of an example method 900 of operating a device having a combiner/divider circuit. At 910, multiple signals from two ports of a combiner/divider circuit are combined into one port of the combiner/divider circuit. The combiner/divider circuit can have an odd-mode capacitor and a low pass network coupled between an isolation resistance of the combiner/divider circuit and the two ports of the combiner/divider circuit. At 920, in another application with respect to a signal, the signal is divided from the one port of the combiner/divider circuit into the two ports of the combiner/divider circuit.

Variations of method 900 or methods similar to the method 900 can include a number of different embodiments that may be combined depending on the application of such methods and/or the architecture of systems in which such methods are implemented. Such methods can include using multiple stages between a first port and the odd-mode capacitor. In various embodiments, the method 900 or methods similar to the method 900 can include combining more than two signals or dividing a signal into more than two signals using one or more additional isolation resistances, one or more additional odd-mode capacitors, and one or more additional low pass networks with each low pass network coupled to a corresponding isolation resistance of the combiner/divider circuit. In various embodiments, the method X00 or methods similar to the method 900 can include using a combiner/divider circuit having inductors in different paths between ports, with the inductors being pair-wise positively coupled inductors with respect to each other.

In various embodiments, a power combiner/divider circuit can comprise: a first path of the combiner/divider circuit from a first port to a second port; a second path of the combiner/divider circuit from the first port to a third port; an isolation resistance coupling the first path to the second path; a first capacitor parallel to the isolation resistance, the first capacitor coupling the first path to the second path, or an inductor parallel to the isolation resistance, the inductor coupling the first path to the second path; and a low pass network coupling the first capacitor to the second port and the third port, with the first capacitor and the low pass network arranged between the isolation resistance and the second and third ports, or a high pass network coupling the inductor to the second port and the third port, with the inductor and the high pass network arranged between the isolation resistance and the second and third ports. In various embodiments, the power combiner/divider circuit can be structured having the first capacitor parallel to the isolation resistance rather than the inductor parallel to the isolation resistance, the first capacitor coupling the first path to the second path, and having the low pass network coupling the first capacitor to the second port and the third port rather than having the high pass network, with the first capacitor and the low pass network arranged between the isolation resistance and the second and third ports.

Variations of such a power combiner/divider circuit or similar power combiner/divider circuits can include a number of different embodiments that may be combined depending on the application of such power combiner/divider circuits and/or the architecture of systems in which such power combiner/divider circuits are implemented. Such power combiner/divider circuits or similar power combiner/divider circuits can include the low pass network structured to include: a second capacitor coupling the first path to the second path, with the second capacitor coupled to the second port on the first path and with the second capacitor coupled to the third port on the second path; a first inductor coupled between the first capacitor and the second capacitor on the first path; and a second inductor coupled between the first capacitor and the second capacitor on the second path.

Variations of such a power combiner/divider circuit or similar power combiner/divider circuits can include multiple stages between the first port and the first capacitor, with each stage including the first path and the second path. The multiple stages can be constructed as two stages.

Variations of a power combiner/divider circuit or similar power combiner/divider circuits can include a third path of the combiner/divider circuit from the first port to a fourth port, a second isolation resistance coupling the first path to the third path; a second capacitor parallel to the third isolation resistance, the second capacitor coupling the first path to the third path; and a second low pass network coupling the second capacitor to the second port and the fourth port, with the second capacitor and the second low pass network arranged between the second isolation resistance and the second and fourth ports; a third isolation resistance coupling the second path to the third path; a third capacitor parallel to the third isolation resistance, the third capacitor coupling the second path to the third path; a third low pass network coupling the third capacitor to the third port and the fourth port, with the third capacitor and the third low pass network arranged between the third isolation resistance and the third and fourth ports. Variations can include the low pass network and the second low pass network sharing a first inductor coupled to the second port. The second low pass network and the third low pass network can share a second inductor coupled to the fourth port. Additionally, the low pass network and the third low pass network can share a third inductor coupled to the third port.

Variations of a power combiner/divider circuit or similar power combiner/divider circuits can include a stage between the first port and the first capacitor, where the stage includes a first inductor configured on the first path coupling the first port to the isolation resistance on the first path, and a second inductor configured on the second path coupling the first port to the isolation resistance on the second path, with the second inductor and the first inductor being positively coupled inductors with respect to each other. Variations can include the low pass network structured to include a second capacitor, a third inductor, and a fourth inductor. The second capacitor can couple the first path to the second path, with the second capacitor coupled to the second port on the first path and with the second capacitor coupled to the third port on the second path. The third inductor can be coupled between the first capacitor and the second capacitor on the first path. The fourth inductor can be coupled between the first capacitor and the second capacitor on the second path, with the fourth inductor and the third inductor being positively coupled inductors with respect to each other.

Variations of a power combiner/divider circuit having a stage between the first port and the first capacitor, where the stage includes a first inductor and a second inductor, with the second inductor and the first inductor being positively coupled inductors with respect to each other, can include a number of variations. One of the variations can include a third path of the combiner/divider circuit from the first port to a fourth port and a third inductor configured on the third path coupling the first port to a second isolation resistance on the third path, with the third inductor and the second inductor being positively coupled inductors with respect to each other and with the third inductor and the first inductor being positively coupled inductors with respect to each other. Variations of such a power combiner/divider circuit or similar power combiner/divider circuits can include the second isolation resistance coupling the second path to the third path; a second capacitor parallel to the second isolation resistance, the second capacitor coupling the second path to the third path; a second low pass network coupling the second capacitor to the third port and the fourth port, with the second capacitor and the second low pass network arranged between the second isolation resistance and the third and fourth ports; a third isolation resistance coupling the first path to the third path; a third capacitor parallel to the third isolation resistance, the third capacitor coupling the first path to the third path; and a third low pass network coupling the third capacitor to the second port and the fourth port, with the third capacitor and the third low pass network arranged between the third isolation resistance and the second and fourth ports. Variations of the power combiner/divider circuit can include the low pass network and the third low pass network sharing a fourth inductor coupled to the second port; the low pass network and the second low pass network sharing a fifth inductor coupled to the third port; and the second low pass network and the third low pass network sharing a sixth inductor coupled to the fourth port. Variations can include the fourth inductor and the fifth inductor being positively coupled inductors with respect to each other; the fifth inductor and the sixth inductor being positively coupled inductors with respect to each other; and the fourth inductor and the sixth inductor being positively coupled inductors with respect to each other.

Another variation of a power combiner/divider circuit having a stage between the first port and the first capacitor, where the stage includes a first inductor and a second inductor, with the second inductor and the first inductor being positively coupled inductors with respect to each other, can include an additional variation to the variation of a third path of the combiner/divider circuit from the first port to a fourth port and a third inductor configured on the third path coupling the first port to a second isolation resistance on the third path, with the third inductor and the second inductor being positively coupled inductors with respect to each other and with the third inductor and the first inductor being positively coupled inductors with respect to each other. The additional variation can include the first, second, and third inductors being disposed on a substrate with the second inductor formed in two inductor sections connected to each other, with one inductor section and the first inductor being positively coupled inductors with respect to each other and with the other inductor section and the third inductor being positively coupled inductors with respect to each other.

In various embodiments, a device for operation of multiple signals can comprise: a means for combining multiple signals or dividing a signal; a means for isolation in the combining of the multiple signals or dividing of the signal; an odd-mode capacitor parallel to the means for isolation; and a means for low pass processing coupled between the odd-mode capacitor and two ports of the means for combining or dividing. Variations of such a device circuit or similar device can include a number of different embodiments that may be combined depending on the application of such devices and/or the architecture of systems in which such devices are implemented. Such devices or similar devices can include one or more additional means for combining multiple signals or dividing a signal along with corresponding means for isolation between a first port and the odd-mode capacitor. Variations can include the means for low pass processing or the means for combining multiple signals or dividing structured to include inductors in different paths between ports, with the inductors being pair-wise positively coupled inductors with respect to each other.

The following are example embodiments of power combiner/divider circuits and methods, in accordance with the teachings herein.

An example power combiner/divider circuit 1 can comprise: a first path of the combiner/divider circuit from a first port to a second port; a second path of the combiner/divider circuit from the first port to a third port; an isolation resistance coupling the first path to the second path; a first capacitor parallel to the isolation resistance, the first capacitor coupling the first path to the second path, or an inductor parallel to the isolation resistance, the inductor coupling the first path to the second path; and a low pass network coupling the first capacitor to the second port and the third port, with the first capacitor and the low pass network arranged between the isolation resistance and the second and third ports, or a high pass network coupling the inductor to the second port and the third port, with the inductor and the high pass network arranged between the isolation resistance and the second and third ports.

An example power combiner/divider circuit 2 can include features of example power combiner/divider circuit 1 and can include the power combiner/divider circuit being structured having the first capacitor parallel to the isolation resistance, the first capacitor coupling the first path to the second path, and having the low pass network coupling the first capacitor to the second port and the third port, with the first capacitor and the low pass network arranged between the isolation resistance and the second and third ports.

An example power combiner/divider circuit 3 can include features of example power combiner/divider circuit 2 and any of the preceding example power combiner/divider circuits and can include the low pass network including: a second capacitor coupling the first path to the second path, with the second capacitor coupled to the second port on the first path and with the second capacitor coupled to the third port on the second path; a first inductor coupled between the first capacitor and the second capacitor on the first path; and a second inductor coupled between the first capacitor and the second capacitor on the second path.

An example power combiner/divider circuit 4 can include features of example power combiner/divider circuit 2 and any of the preceding example power combiner/divider circuits and can include the combiner/divider circuit including multiple stages between the first port and the first capacitor, with each stage including the first path and the second path.

An example power combiner/divider circuit 5 can include features of example power combiner/divider circuit 2 and any of the preceding example power combiner/divider circuits and can include the combiner/divider circuit including: a third path of the combiner/divider circuit from the first port to a fourth port; a second isolation resistance coupling the first path to the third path; a second capacitor parallel to the second isolation resistance, the second capacitor coupling the first path to the third path; and a second low pass network coupling the second capacitor to the second port and the fourth port, with the second capacitor and the second low pass network arranged between the second isolation resistance and the second and fourth ports; a third isolation resistance coupling the second path to the third path; a third capacitor parallel to the third isolation resistance, the third capacitor coupling the second path to the third path; a third low pass network coupling the third capacitor to the third port and the fourth port, with the third capacitor and the third low pass network arranged between the third isolation resistance and the third and fourth ports.

An example power combiner/divider circuit 6 can include features of example power combiner/divider circuit 5 and any of the preceding example power combiner/divider circuits and can include the low pass network and the second low pass network sharing a first inductor coupled to the second port; the second low pass network and the third low pass network sharing a second inductor coupled to the fourth port; and the low pass network and the third low pass network sharing a third inductor coupled to the third port.

An example power combiner/divider circuit 7 can include features of example power combiner/divider circuit 2 and any of the preceding example power combiner/divider circuits and can include the combiner/divider circuit including a stage between the first port and the first capacitor, the stage including: a first inductor configured on the first path coupling the first port to the isolation resistance on the first path; and a second inductor configured on the second path coupling the first port to the isolation resistance on the second path, with the second inductor and the first inductor being positively coupled inductors with respect to each other.

An example power combiner/divider circuit 8 can include features of example power combiner/divider circuit 7 and any of the preceding example power combiner/divider circuits and can include the low pass network including: a second capacitor coupling the first path to the second path, with the second capacitor coupled to the second port on the first path and with the second capacitor coupled to the third port on the second path; a third inductor coupled between the first capacitor and the second capacitor on the first path; and a fourth inductor coupled between the first capacitor and the second capacitor on the second path, with the fourth inductor and the third inductor being positively coupled inductors with respect to each other.

An example power combiner/divider circuit 9 can include features of example power combiner/divider circuit 7 and any of the preceding example power combiner/divider circuits and can include the combiner/divider circuit including: a third path of the combiner/divider circuit from the first port to a fourth port; and a third inductor configured on the third path coupling the first port to a second isolation resistance on the third path, with the third inductor and the second inductor being positively coupled inductors with respect to each other and with the third inductor and the first inductor being positively coupled inductors with respect to each other.

An example power combiner/divider circuit 10 can include features of example power combiner/divider circuit 9 and any of the preceding example power combiner/divider circuits and can include the combiner/divider circuit including: the second isolation resistance coupling the second path to the third path; a second capacitor parallel to the second isolation resistance, the second capacitor coupling the second path to the third path; a second low pass network coupling the second capacitor to the third port and the fourth port, with the second capacitor and the second low pass network arranged between the second isolation resistance and the third and fourth ports; a third isolation resistance coupling the first path to the third path; a third capacitor parallel to the third isolation resistance, the third capacitor coupling the first path to the third path; and a third low pass network coupling the third capacitor to the second port and the fourth port, with the third capacitor and the third low pass network arranged between the third isolation resistance and the second and fourth ports.

An example power combiner/divider circuit 11 can include features of example power combiner/divider circuit 10 and any of the preceding example power combiner/divider circuits and can include the low pass network and the third low pass network sharing a fourth inductor coupled to the second port; the low pass network and the second low pass network sharing a fifth inductor coupled to the third port; and the second low pass network and the third low pass network sharing a sixth inductor coupled to the fourth port.

An example power combiner/divider circuit 12 can include features of example power combiner/divider circuit 11 and any of the preceding example power combiner/divider circuits and can include the fourth inductor and the fifth inductor being positively coupled inductors with respect to each other; the fifth inductor and the sixth inductor being positively coupled inductors with respect to each other; and the fourth inductor and the sixth inductor being positively coupled inductors with respect to each other.

An example power combiner/divider circuit 13 can include features of example power combiner/divider circuit 9 and any of the preceding example power combiner/divider circuits and can include the first, second, and third inductors being disposed on a substrate with the second inductor formed in two inductor sections connected to each other, with one inductor section and the first inductor being positively coupled inductors with respect to each other and with the other inductor section and the third inductor being positively coupled inductors with respect to each other.

An example device 1 for operation of multiple signals can comprise; a means for combining multiple signals or dividing a signal; a means for isolation in the combining of the multiple signals or dividing of the signal; an odd-mode capacitor parallel to the means for isolation; and a means for low pass processing coupled between the odd-mode capacitor and two ports of the means for combining or dividing.

An example device 2 for operation of multiple signals can include features of example device 1 for operation of multiple signals and can include one or more additional means for combining multiple signals or dividing a signal along with corresponding means for isolation between a first port and the odd-mode capacitor.

An example device 3 for operation of multiple signals can include features of any of the preceding example devices for operation of multiple signals and can include the means for low pass processing or the means for combining multiple signals or dividing a signal including inductors in different paths between ports, with the inductors being pair-wise positively coupled inductors with respect to each other.

An example method 1 of operating a device having a combiner/divider circuit can comprise: combining multiple signals or dividing a signal using a combiner/divider circuit, the combiner/divider circuit having an odd-mode capacitor and a low pass network coupled between an isolation resistance of the combiner/divider circuit and two ports of the combiner/divider circuit.

An example method 2 of operating a device having a combiner/divider circuit can include features of example method 1 of operating a device having a combiner/divider circuit and can include using multiple stages between a first port and the odd-mode capacitor.

An example method 3 of operating a device having a combiner/divider circuit can include features of any of the preceding example methods of operating a device having a combiner/divider circuit and can include combining more than two signals or dividing a signal into more than two signals using one or more additional isolation resistances, one or more additional odd-mode capacitors, and one or more additional low pass networks with each low pass network coupled to a corresponding isolation resistance of the combiner/divider circuit.

An example method 4 of operating a device having a combiner/divider circuit can include features of any of the preceding example methods of operating a device having a combiner/divider circuit and can include using a combiner/divider circuit having inductors in different paths between ports, with the inductors being pair-wise positively coupled inductors with respect to each other.

An example method 5 of operating a device having a combiner/divider circuit can include features of any of the preceding example methods of operating a device having a combiner/divider circuit and can include performing functions associated with any features of example power combiner/divider circuits 1-13, example devices for operation of multiple signals, and any features of example power combiner/divider circuits associated with the figures herein.

The above detailed description refers to the accompanying drawings that show, by way of illustration and not limitation, various embodiments that can be practiced. These embodiments are described in sufficient detail to enable those skilled in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The above detailed description is, therefore, not to be taken in a limiting sense.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A power combiner/divider circuit comprising:
   a first path of the combiner/divider circuit from a first port to a second port;
   a second path of the combiner/divider circuit from the first port to a third port;
   a base structure including:
   an isolation resistance coupling the first path to the second path;
   a first inductor configured on the first path coupling the first port to the isolation resistance on the first path; and
   a second inductor configured on the second path coupling the first port to the isolation resistance on the second path, with the second inductor and the first inductor being positively coupled inductors with respect to each other; and
   a third inductor parallel to the isolation resistance, the third inductor coupling the first path to the second path, and a high pass network coupling the third inductor to the second port and the third port, with the third inductor and the high pass network arranged between the isolation resistance and the second and third ports.

2. A power combiner/divider circuit comprising:
   a first path of the combiner/divider circuit from a first port to a second port;
   a second path of the combiner/divider circuit from the first port to a third port;
   a base structure including:
   an isolation resistance coupling the first path to the second path;
   a first inductor configured on the first path coupling the first port to the isolation resistance on the first path; and
   a second inductor configured on the second path coupling the first port to the isolation resistance on the second path, with the second inductor and the first inductor being positively coupled inductors with respect to each other; and
   a first capacitor parallel to the isolation resistance, the first capacitor coupling the first path to the second path, and a low pass network coupling the first capacitor to the second port and the third port, with the first capacitor and the low pass network arranged between the isolation resistance and the second and third ports, and
   wherein the combiner/divider circuit includes multiple stages between the first port and the first capacitor, with each stage including the first path and the second path.

3. The power combiner/divider circuit of claim 2, wherein the low pass network includes:
   a second capacitor coupling the first path to the second path, with the second capacitor coupled to the second port on the first path and with the second capacitor coupled to the third port on the second path;
   a first low pass network inductor coupled between the first capacitor and the second capacitor on the first path; and
   a second low pass network inductor coupled between the first capacitor and the second capacitor on the second path.

4. The power combiner/divider circuit of claim 2, wherein the combiner/divider circuit includes:
   a third path of the combiner/divider circuit from the first port to a fourth port;
   a second isolation resistance coupling the first path to the third path;
   a second capacitor parallel to the second isolation resistance, the second capacitor coupling the first path to the third path;
   a second low pass network coupling the second capacitor to the second port and the fourth port, with the second capacitor and the second low pass network arranged between the second isolation resistance and the second and fourth ports;
   a third isolation resistance coupling the second path to the third path;
   a third capacitor parallel to the third isolation resistance, the third capacitor coupling the second path to the third path; and
   a third low pass network coupling the third capacitor to the third port and the fourth port, with the third capacitor and the third low pass network arranged between the third isolation resistance and the third and fourth ports.

5. The power combiner/divider circuit of claim 4, wherein the low pass network and the second low pass network share a first low pass inductor coupled to the second port; the second low pass network and the third low pass network share a second low pass inductor coupled to the fourth port; and the low pass network and the third low pass network share a third low pass inductor coupled to the third port.

6. The power combiner/divider circuit of claim 2, wherein the first and second inductors of the base structure are included in metal layers formed on a single substrate and are mutual positive coupled inductors.

7. The power combiner/divider circuit of claim 6, wherein the low pass network includes:
   a second capacitor coupling the first path to the second path, with the second capacitor coupled to the second port on the first path and with the second capacitor coupled to the third port on the second path;
   a fourth inductor coupled between the first capacitor and the second capacitor on the first path; and
   a fifth inductor coupled between the first capacitor and the second capacitor on the second path, with the fifth inductor and the fourth inductor being positively coupled inductors with respect to each other.

8. The power combiner/divider circuit of claim 6, wherein the combiner/divider circuit includes:
   a third path of the combiner/divider circuit from the first port to a fourth port; and
   a fourth inductor configured on the third path coupling the first port to a second isolation resistance on the third path, with the fourth inductor and the second inductor being positively coupled inductors with respect to each other and with the fourth inductor and the first inductor being positively coupled inductors with respect to each other.

9. The power combiner/divider circuit of claim 8, wherein the combiner/divider circuit includes:
   the second isolation resistance coupling the second path to the third path;
   a second capacitor parallel to the second isolation resistance, the second capacitor coupling the second path to the third path;
   a second low pass network coupling the second capacitor to the third port and the fourth port, with the second capacitor and the second low pass network arranged between the second isolation resistance and the third and fourth ports;
   a third isolation resistance coupling the first path to the third path;
   a third capacitor parallel to the third isolation resistance, the third capacitor coupling the first path to the third path; and
   a third low pass network coupling the third capacitor to the second port and the fourth port, with the third capacitor and the third low pass network arranged between the third isolation resistance and the second and fourth ports.

10. The power combiner/divider circuit of claim 9, wherein the low pass network and the third low pass network share a fifth inductor coupled to the second port; the low pass network and the second low pass network share a sixth inductor coupled to the third port; and the second low pass network and the third low pass network share a seventh inductor coupled to the fourth port.

11. The power combiner/divider circuit of claim 10, wherein the fifth inductor and the sixth inductor are positively coupled inductors with respect to each other; the sixth inductor and the seventh inductor are positively coupled inductors with respect to each other; and the fifth inductor and the seventh inductor are positively coupled inductors with respect to each other.

12. The power combiner/divider circuit of claim 8, wherein the first, second, and fourth inductors are disposed on the substrate with the second inductor formed in two inductor sections connected to each other, with one inductor section and the first inductor being positively coupled inductors with respect to each other and with the other inductor section and the fourth inductor being positively coupled inductors with respect to each other.

13. A method of operating a device having a combiner/divider circuit, the method comprising:
   combining multiple signals or dividing a signal using a combiner/divider circuit, the combiner/divider circuit including:
   a base structure having a first inductor configured on a first path of the combiner/divider circuit, a second inductor configured on a second path of the combiner/divider circuit, an isolation resistance coupling the first path to the second path, and an odd-mode capacitor coupled in parallel to the isolation resistance, wherein the first and second inductors are positively coupled inductors with respect to each other; and
   a low pass network coupled between the isolation resistance of the combiner/divider circuit and two ports of the combiner/divider circuit; and
   using multiple stages between a first port and the odd-mode capacitor.

14. The method of claim 13, wherein the method includes combining more than two signals or dividing a signal into more than two signals using one or more additional isolation resistances, one or more additional odd-mode capacitors, and one or more additional low pass networks with each low pass network coupled to a corresponding isolation resistance of the combiner/divider circuit.

15. The method of claim 13, wherein the first and second inductors are pair-wise positively coupled inductors with respect to each other.

16. A device for operation of multiple signals, the device comprising:
   a means for combining multiple signals or dividing a signal, wherein the means for combining includes a first inductor configured on a first signal path and a second inductor configured on a second signal path and the first and second inductors positively mutual coupled with respect to each other;
   a means for isolation in the combining of the multiple signals or dividing of the signal;
   an odd-mode capacitor parallel to the means for isolation;
   a means for low pass processing coupled between the odd-mode capacitor and two ports of the means for combining or dividing; and
   one or more additional means for combining multiple signals or dividing a signal along with corresponding means for isolation between a first port and the odd-mode capacitor.

17. The device of claim 16, wherein the means for combining multiple signals or dividing a signal includes the first and second inductors in different paths between ports, with the inductors being pair-wise positively coupled inductors with respect to each other.

* * * * *